(12) United States Patent
Hjort et al.

(10) Patent No.: US 7,104,805 B2
(45) Date of Patent: Sep. 12, 2006

(54) BOARD TO BOARD CURRENT CONNECTION

(75) Inventors: Thomas Enné Hjort, Vejle (DK); Ditlev Petersen, Kolding (DK)

(73) Assignee: American Power Conversion Corporation, West Kingston, RI (US)

( * ) Notice: Subject to any disclaimer, the term of this patent is extended or adjusted under 35 U.S.C. 154(b) by 0 days.

(21) Appl. No.: 10/931,296

(22) Filed: Aug. 31, 2004

(65) Prior Publication Data

US 2006/0046532 A1    Mar. 2, 2006

(51) Int. Cl.
   *H01R 12/00* (2006.01)
(52) U.S. Cl. .................................................. 439/74
(58) Field of Classification Search ............... 439/74, 439/92, 95, 91, 75, 65, 66, 591; 361/807, 361/790
See application file for complete search history.

(56) References Cited

U.S. PATENT DOCUMENTS

| | | | | |
|---|---|---|---|---|
| 4,860,784 A | * | 8/1989 | Petersen et al. | 137/315.28 |
| 5,228,873 A | * | 7/1993 | Hirai | 439/607 |
| 6,049,467 A | * | 4/2000 | Tamarkin et al. | 361/790 |
| 6,356,448 B1 | | 3/2002 | DiBene, II et al. | |
| 6,535,394 B1 | * | 3/2003 | Hirzmann | 361/761 |
| 6,644,903 B1 | * | 11/2003 | Arand | 411/352 |
| 6,741,480 B1 | | 5/2004 | Hartke et al. | |
| 6,817,804 B1 | * | 11/2004 | Le Gallo et al. | 403/408.1 |
| 6,822,878 B1 | * | 11/2004 | Dobbs et al. | 361/807 |
| 6,860,784 B1 | * | 3/2005 | Chernov et al. | 446/118 |
| 2002/0176229 A1 | | 11/2002 | Derian et al. | |
| 2003/0080270 A1 | * | 5/2003 | Gibson et al. | 248/288.11 |

* cited by examiner

*Primary Examiner*—Tulsidas C. Patel
*Assistant Examiner*—Phuongchi Nguyen
(74) *Attorney, Agent, or Firm*—Lowrie, Lando & Anastasi, LLP

(57) ABSTRACT

A connector for providing a high current connection between printed circuit boards. The connector comprises a fastener, an electrically conductive spacer, and a nut. The fastener extends through a through-hole in each of the printed circuit boards. The spacer is disposed about the fastener and between the printed circuit boards. The nut engages a distal end of the fastener and forces the spacer into electrical contact with electrically conductive pads that at least partially surround each of the through-holes on sides of the printed circuit board that face one another. The nut may be press fit or otherwise captivated, or formed integrally in one of the printed circuit boards such that the electrical connection may be effected from a single direction. The spacer may be optimized for electrical conduction while the fastener and/or nut may be optimized for strength, rigidity, low cost, or a combination of such factors.

35 Claims, 6 Drawing Sheets

BOARD TO BOARD CURRENT CONNECTION

BACKGROUND OF THE INVENTION

1. Field of Invention

The present invention relates to electrical connectors and more particularly, to electrical connectors that can provide a high current connection between adjacent printed circuit boards.

2. Discussion of Related Art

As known to those skilled in the art, conventional techniques for providing a high current connection between adjacent printed circuit boards suffer from a number of disadvantages, including increased parts count, decreased reliability or testability, and increased cost of manufacture. For example, where a stranded wire connection is used to provide a high current connection between adjacent printed circuit boards, each of the ends of the wire is typically electrically and mechanically connected (such as by crimping and/or soldering) to a post, which is then electrically and mechanically connected to a copper pad on each of the adjacent printed circuit boards. Typically, a fastener, such as a screw, is inserted through the post and then through a through-hole in each of the printed circuit boards, with the threaded end of the screw being captured by a nut disposed on the opposite side of the printed circuit board from the head of the screw. Such conventional high current connections are relatively expensive and generally require that both sides of each of the adjacent printed circuit boards be accessible, as the fastener is inserted from one side of the board, and the nut is applied from the other. Because the quality of the electrical connection between the adjacent printed circuit boards depends on the degree to which the nut is tightened on the screw, care must be exercised in applying sufficient torque to the screw (and/or nut) to achieve a good electrical connection without physically damaging the printed circuit board. Although a torque wrench or screwdriver may be used, it may be difficult to discern when the appropriate amount of torque has been provided, given the limited accessibility to at least one side of each printed circuit board.

SUMMARY OF THE INVENTION

According to one aspect of the present invention, a connector is provided to electrically couple printed circuit boards. Each of the printed circuit boards has an aperture therethrough that is at least partially surrounded by an electrical conductor disposed on a first side of each of the printed circuit boards. The connector comprises a fastener that extends through each aperture of the printed circuit boards, an electrically conductive spacer that in use, is disposed about the fastener and between the printed circuit boards, and a nut to engage a distal portion of the fastener and force the spacer into electrical contact with the electrical conductor disposed on the first side of each of the printed circuit boards. In one embodiment, the nut may be an integral part of one of the printed circuit boards, such as where the one of the printed circuit boards is formed from an aluminum or copper material and the aperture therethrough has threads cut therein to receive and engage threads formed on the distal end of the fastener.

According to another aspect of the present invention, an assembly is provided. The assembly comprises a pair of printed circuit boards, a fastener, an electrically conductive spacer, and a nut. Each printed circuit board of the pair of printed circuit boards has a first side, a second side, and an aperture therethrough, the aperture being at least partially surrounded by an electrical conductor on the first side of each printed circuit board. The fastener extends through the aperture of each printed circuit board, and the electrically conductive spacer is disposed about the fastener and between each printed circuit board. The nut engages a distal portion of the fastener and forces the spacer into electrical contact with the electrical conductor disposed on the first side of each printed circuit board. Advantageously, in one embodiment, the nut may be integrally formed within one of the pair of printed circuit boards, and in another embodiment, the spacer may be formed from two distinct materials including a first electrically conducting material, and a second electrically insulating material.

According to a further aspect of the present invention, a method of electrically connecting a pair of printed circuit boards is provided. Each of the pair of printed circuit boards has a first side, a second side, and an aperture therethrough, the aperture being at least partially surrounded by an electrical conductor on the first side of each printed circuit board of the pair of printed circuit boards. The method comprises acts of inserting a distal portion of a fastener through the aperture in a first printed circuit board of the pair of printed circuit boards, placing an electrically conductive spacer on the distal portion of the fastener, guiding the distal portion of the fastener into the aperture of a second printed circuit board of the pair of printed circuit boards, and tightening the fastener to force the spacer into electrical contact with the electrical conductor disposed on the first side of each printed circuit board.

According to yet a further aspect of the present invention, an assembly is provided that comprises a pair of printed circuit boards each having a first side, a second side, and an aperture therethrough. The aperture is at least partially surrounded by an electrical conductor on the first side of each printed circuit board of the pair of printed circuit boards, and the assembly further comprises means for electrically conducting a current between the first side of each printed circuit board, and means for mechanically forcing the electrical conductor on the first side of each printed circuit board into electrical contact with the means for electrically conducting the current, wherein the means for mechanically forcing is independent of the means for electrically conducting. In one embodiment, the means for electrically conducting the current may be electrically isolated from the means for mechanically forcing.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Various embodiments and aspects thereof will now be discussed in detail with reference to the accompanying figures. It is to be appreciated that this invention is not limited in its application to the details of construction and the arrangement of components set forth in the following description or illustrated in the drawings. The invention is capable of other embodiments and of being practiced or of being carried out in various ways. Examples of specific implementations are provided herein for illustrative purposes only. In particular, acts, elements and features discussed in connection with one embodiment are not intended to be excluded from a similar role in other embodiments. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Figure 1:
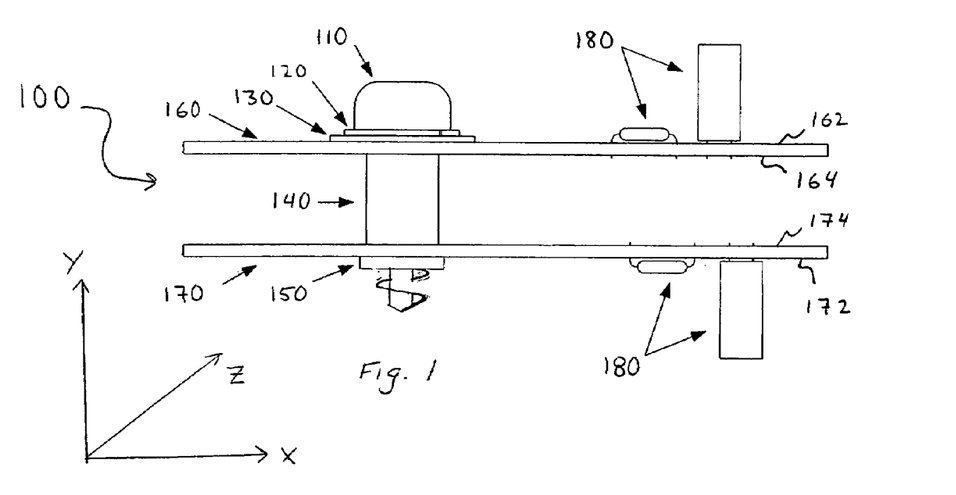
FIG. 1 is a side view of a connector that provides a high current connection between adjacent printed circuit boards according to one embodiment of the present invention.

FIG. 1 illustrates a connector that is capable of providing a high current connection between adjacent printed circuit boards according to an embodiment of the present invention. According to one aspect of the present invention, the connector may be installed from only a single direction and utilizes a minimal number of distinct components. Such simplicity increases the probability of a reliable connection and minimizes the possibility of errors. That portion of the connector that mechanically secures the connection need not conduct the current between adjacent boards, such that the current carrying portion of the connector and the mechanical fastening portion of the connector may each be separately optimized for the particular use. The connector provides a reliable, simple, verifiable, and strong connection between adjacent printed circuit boards.

As shown in FIG. 1, the connector 100 may be used to transport a high current between a pair of adjacent printed circuit boards 160, 170 that are at least partially aligned in one (e.g., a vertical or Y) direction. The connector 100 includes a fastener 110, a spacer 140, and a nut 150. As described in more detail with respect to FIGS. 2 and 4 further below, the distal end 112 of the fastener 110 is preferably threaded, as is at least a portion of the interior cylindrical surface of the nut 150. In one embodiment, the connector 100 may also include a spring washer 120 and a flat washer 130, as described in more detail with respect to FIG. 5 below.

To assemble the connector 100, the spring washer 120 and the flat washer 130 are fitted onto a distal end (112, see FIG. 2) of the fastener 110, and the distal end 112 of the fastener 110 is inserted through a through-hole in one of the printed circuit boards 160, 170 (e.g., printed circuit board 160 in FIG. 1). Where either the spring washer 120 and/or the flat washer 130 is not used, the distal end 112 of the fastener 110 may be inserted directly through the through-hole in the printed circuit board 160, or through the spring washer 120 or the flat washer 130, and then through the printed circuit board 160. The spacer 140 is fitted onto the distal end 112 of the fastener 110 that protrudes through the printed circuit board 160, and the distal end 112 of the fastener 110 is guided through a through-hole in the adjacent printed circuit board 170. The nut 150 is then applied to the distal end 112 of the fastener 110 and tightened.

According to one embodiment, the nut 150 may be fastened to a surface of the adjacent printed circuit board 170, for example, by the use of an adhesive, or alternatively, by soldering. Alternatively still, the nut 150 may be press-fit into the through-hole of the adjacent printed circuit board (e.g., into the under-surface of printed circuit board 170 in FIG. 1). The through-hole may be a plated through-hole, or not, and type of press-fit nut 150 may be selected based upon whether the through-hole is plated or not. Where the nut 150 is press-fit or mechanically fastened to the surface of the adjacent printed circuit board, assembly of connector 100 may be performed in a manner that requires use of only a single tool, such as for example a screwdriver or an Allen wrench, and in a manner that requires access from only one side (e.g., side 162) of the pair of adjacent printed circuit boards. A calibrated torque wrench or other tool may be used to provide an appropriate amount of torque to the fastener.

According to another embodiment of the present invention, the nut 150 may be integrally formed in one of the pair of adjacent circuit boards. For example, where printed circuit board 170 is formed from an aluminum or copper material, such as a Thermal Clad® printed circuit board, available from The Bergquist Company, located in Prescott, Wis., threads adapted to receive and engage the distal end 112 of the fastener 110 may be cut into the through-hole in printed circuit board 170, dispensing with the use of a separate nut 150. As in the previously described embodiment, a calibrated torque wrench or other tool may be used to provide an appropriate amount of torque to the fastener 110.

Although the connector 100 is illustrated as being used with a pair of adjacent circuit boards 160, 170 that are populated with through-hole electrical components 180 on only one side, it should be appreciated that the present invention is not so limited. For example, the connector 100 may also be used with adjacent printed circuit boards having surface mounted electrical components disposed on one side, or disposed on both sides. Alternatively, one of the adjacent printed circuit boards may be populated with through-hole components on one side, and surface mount components on the other. In general, embodiments of the present invention may be used in any board to board current connection wherein the sides of the printed circuit boards facing each other have a suitable electrically conducting pad, for example, formed from copper or another conductive material, disposed on their surface to make electrical contact with the spacer 140 when the connector 100 is properly assembled. The spacer 140 then provides a path for the conduction of current between the adjacent printed circuit boards.

It should be appreciated that although the connector 100 is described herein as being used to provide an electrical connection between a pair of adjacent printed circuit boards, more than two adjacent printed circuit boards may be electrically connected. For example, by lengthening the fastener 110, and providing an additional spacer, three or more adjacent printed circuit boards may be inter-connected, with a spacer being disposed between adjacent printed circuit boards. It should also be appreciated that although embodiments of the present invention are described with reference to adjacent printed circuit boards that are at least partially aligned with one another in a vertical (i.e., Y) direction, they may alternatively be at least partially aligned in another (i.e., a horizontal or X) direction.

Figure 2:
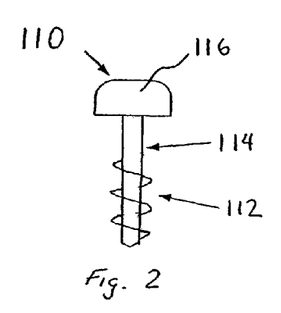
FIG. 2 is a side view of a fastener that may be used in the connector of FIG. 1.

As shown in FIG. 2, the proximal end 116 of the fastener 110 has an enlarged head that is adapted to mate with the distal end of a tool (not shown), such as a screw driver, Allen wrench, or other type of fastening tool. The tool may be calibrated to provide a determined amount of torque to the fastener to ensure the connection. The distal end 112 of the fastener 110 is threaded with a plurality of threads, while a central region 114 of the fastener 110 is unthreaded. According to one embodiment of the present invention, the length of the central region 114 of the fastener 110 is greater than a length of the proximal portion 142 of the spacer 140 (which may be internally threaded, see FIG. 3) so that the spacer 140 may be threaded onto the distal end 112 of the fastener 110 until the spacer 140 is loose from the threads on the distal end 112 of the fastener 110. The threads on the distal end 112 of the fastener 110 thus prevent the spacer 140 from falling off the distal end 112 of the fastener 110 during assembly of the connector 100, while permitting free movement of the spacer 140 proximally, distally, and/or rotationally on the fastener 110.

Figures 3, 4:
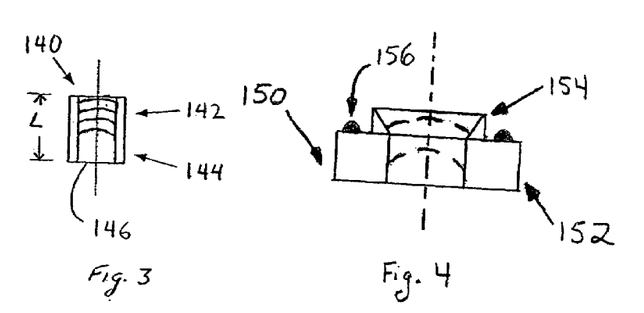
FIG. 3 is a cross-sectional side view of a spacer that may be used in the connector of FIG. 1.
FIG. 4 is a side view of a nut that may be used in the connector of FIG. 1.

As shown in the cross-sectional side view of FIG. 3, the spacer 140 has an outwardly cylindrical shape with a bore 146 therethrough to receive the fastener 110. It should be appreciated that the spacer 140 may have other than an outwardly cylindrical shape, as the present invention is not so limited. However, because the proximal and distal ends of the spacer 140 are both circular in shape, a circularly shaped electrically conducting pad may be used on the contacting surfaces of the printed circuit boards, and the spacer 140 may be rotated about the longitudinal axis of the fastener without any loss in electrical conductance. Although the bore 146 depicted in FIG. 3 is circular in shape, it should be appreciated that other shapes may be used, as the present invention is not so limited. In this regard, the bore may have any shape that allows it to receive the threads on the distal end 112 of the fastener 110 and hold the spacer 140 on the distal end 112 of the fastener during assembly of the connector 100.

According to one embodiment, the proximal portion 142 of the bore 146 is internally threaded and adapted to engage with the plurality of threads on the distal end 112 of the fastener 110, but the distal portion 144 of the bore 146 is not threaded. During assembly, the spacer 140 may be threaded onto the distal end 112 of the fastener 110 to a point where the threads in the proximal portion 142 of the bore no longer engage the threads on the distal end 112 of the fastener 110, such that the spacer 140 is retained on the fastener, but may be freely rotated and may move freely proximally and distally on the fastener 110.

It should be appreciated that numerous alternatives to the above described spacer 140 may also be used. For example, in one alternative embodiment, the spacer 140 may be continuously internally threaded, and the length (L) of the spacer 140 selected to be less than the length of the central region 114 of the fastener 110, so that the spacer 140 can freely rotate about, and move proximally and distally along, the central region 114 of the fastener 110. Alternatively still, the fastener 110 may be continuously threaded, and the bore 146 of the spacer enlarged in diameter, but left unthreaded, although such an alternative would make assembly of the connector 100 more difficult, as the spacer 140 would not be retained on the fastener 110. In a further alternative embodiment, rather than having any threads cut therein, a simple pin like protrusion (similar to that shown in FIGS. 9–10, described in detail further below) may be disposed within the bore 146 of the spacer 140 to engage the threaded distal end 112 of the fastener 110 and prevent the spacer 140 from falling off the distal end 112 of the fastener 110 during assembly. Indeed, numerous alternative designs may be readily contemplated, as the engagement of the spacer 140 with the distal end of the fastener 110 need not possess great strength for the spacer 140 to remain attached to the distal end of the fastener during assembly.

It should be appreciated that the length (L) of the spacer 140 may vary, depending on the distance between the adjacent printed circuit boards with which it is used, as well as other factors, such as safety and thermal/ventilation concerns. For example, safety standards or thermal/ventilation concerns may require a proscribed minimum distance between adjacent printed circuit boards, depending upon the amount of current being conducted, or based upon thermal modeling. The spacer 140 may be made from any suitably conductive material, such as brass, copper, aluminum, etc., and should preferably be mechanically stable over the ranges of temperature anticipated during use. The spacer may be formed as a single unit, or alternatively may be formed in parts, for example using an outer portion optimized for conduction and mechanical stability, and an inner portion made from a different material that need not possess great strength, and may be conductive, or as discussed further below, may be made from an electrically insulating material. It should be appreciated that because the portion of the connector carrying current is the spacer 140 and not the fastener itself, the spacer 140 may be optimized for electrical conduction while the fastener may be optimized for strength, rigidity, low cost, or a combination of such factors. In one embodiment, the spacer 140 is formed from brass, and the fastener 110 is formed from steel.

Figure 6:
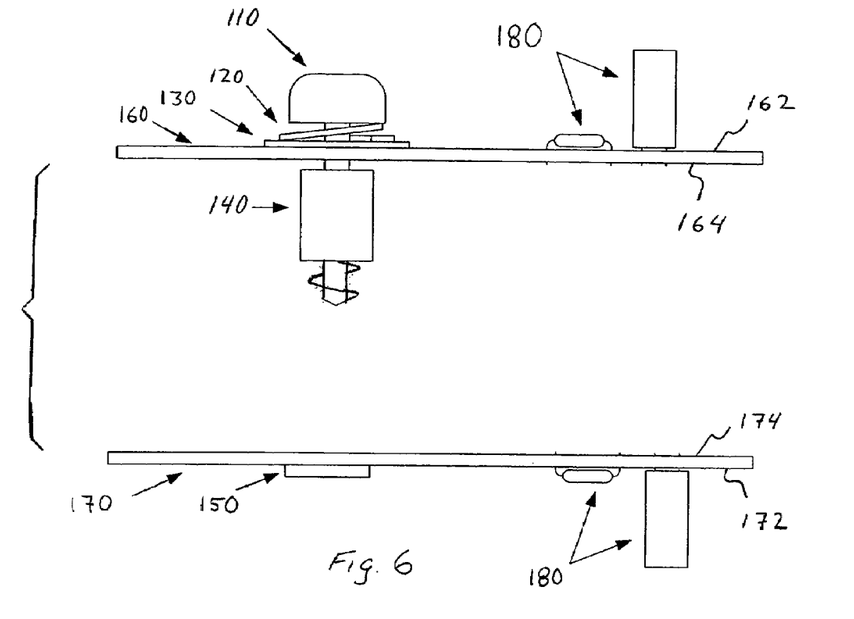
FIG. 6 illustrates the manner in which a high current connection between adjacent printed circuit boards may be effected in accordance with one embodiment of the present invention.

As shown in FIG. 4, the nut 150 includes a plurality of internal threads adapted to engage the distal end 112 of the fastener 110. In the embodiment illustrated in FIG. 4, the nut 150 is outwardly circular in shape, although it should be appreciated that other shapes may be used. The proximal portion 154 of the nut 150 is circular in shape and has a reduced outside diameter relative to the circularly-shaped distal portion 152 of the nut 150, so that the nut 150 may be press fit into a circularly-shaped through-hole in the printed circuit board 170 (FIG. 6). The nut 150 may include means for preventing rotation of the nut 150 during assembly of the connector 100. For example, the nut 150 may include protrusions 156 or other mating features (not shown) formed on a side of the nut that faces the printed circuit board to engage with depressions or complementary mating features formed in a surface of the printed circuit board. Other means for preventing rotation of the nut during assembly may be readily envisioned by those skilled in the art. Alternatively, rather than being outwardly circular in shape, the nut 150 may have an outward shape that prevents rotation of the nut 150 during assembly of the connector 100. For example, the proximal portion 154 of the nut 150 may have a square or hexagonal shape to be press fit within a square-shaped or hexagonally-shaped through-hole in the printed circuit board 170 to prevent rotation of the nut 150 during assembly. Because the nut 150 is not used to carry current, it may also be optimized for strength, rigidity and low cost, and may be made from any suitable material, such as steel.

Figure 5:
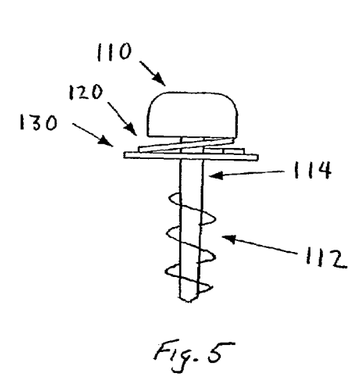
FIG. 5 is a side view of the fastener of FIG. 2 that includes a spring washer and a flat washer and may be used in the connector of FIG. 1.

According to one embodiment of the present invention, the connector 100 may also include a spring washer 120 and a flat washer 130, as illustrated in FIG. 5. The spring washer 120 and the flat washer 130 may be formed from any suitable material and may be conductive, or insulating. Where the spring washer 120 and the flat washer 130 are used together, the distal end 112 of the fastener 110 is preferably inserted first through the spring washer 120 and then through the flat washer 130, so that the spring washer 120 is disposed adjacent to the head of the fastener, and the flat washer 130 is disposed adjacent to the surface of the printed circuit board. The spring force of the spring washer 120 may be selected to maintain a relatively constant torque that draws the adjacent printed circuit boards together with the spacer 140 therebetween, even during temperature variations and the resulting expansion and contraction of the materials from which the connector and the printed circuit boards are made.

Alternatively, rather than using a spring washer and a flat washer 130, a single washer may be used. For example, in alternative embodiments (not shown), a single serrated lock washer may be used, and in another embodiment, a single disk shaped washer may be used. In each of these embodiments, the washer or washers (e.g., the spring washer 120 and the flat washer 130, or the serrated or disc-shaped washer) may be preassembled with the fastener 110 and provided together with the fastener as a single unit, with the washer or washers mounted to the fastener in a manner in which they cannot fall off.

FIG. 6 illustrates the manner in which a high current connection between adjacent printed circuit boards may be effected in accordance with an embodiment of the present invention. As shown, the distal end 112 of fastener 110 is inserted through or mounted with spring washer 120 and flat washer 130, and then inserted through a through-hole in a first printed circuit board 160 having electrical components mounted thereon. The spacer 140 may then be applied to the distal end 112 of the fastener 110, and the distal end 112 of the fastener 110 advanced through a through-hole in the second printed circuit board 170 and into the nut 150. The nut 150 may be press fit into the through-hole, as discussed above. A tool, such as a screwdriver or Allen wrench may then be used to tighten the fastener until the spring washer 120 is compressed. As discussed above, a calibrated tool may be used to apply a determined amount of torque.

Although well suited for high current connections on the order of approximately 100 amperes or less, or more preferably, approximately 10–60 amperes, embodiments of the present invention may also be used in connections where higher or lower currents are present. Irrespective of the level of current conducted between adjacent printed circuit boards, embodiments of the present invention provide a reliable, simple, verifiable, and strong connection between adjacent circuit boards.

Embodiments of the present invention may include only a fastener, a spacer, and a nut, thereby providing a simple connection with a minimal number of components. In one embodiment, the nut may be integrally formed in one of the printed circuit boards to further reduce the number of components. Such simplicity increases the probability of a reliable connection and minimizes the possibility of errors. Because that portion of the connector that mechanically secures the connection (e.g., the fastener 110 and the nut 150) need not be used to conduct the current between adjacent boards, the mechanical fastening portion of the connector and the current carrying portion may each be separately optimized for the particular use. Where the connector includes a spring washer, the integrity of the connection may be easily validated, and the spring washer ensures a reliable connection even during changes in temperature and/or humidity. Further, embodiments of the present invention do not require access from multiple and opposing directions, and thus, where desired, several of the same type of connections may be easily and reliably made, thereby providing fault tolerance.

According to another embodiment of the present invention, a connector is provided to electrically conduct current between adjacent printed circuit boards, wherein that portion of the connector that conducts electrical current is independent of, and electrically isolated from, the portion of the conductor that mechanically secures the connector. Details of this embodiment are now described with respect to FIGS. 7–18, wherein those elements that are identical or nearly identical to elements described previously with respect to FIGS. 1–6 are represented by the same reference numeral.

As shown in FIGS. 7–18, and in accordance with another embodiment of the present invention, the connector 100 is again used to transport a relatively high current between a pair of adjacent printed circuit boards 160, 170 (see FIGS. 17–18) that are at least partially aligned in one direction. Further, the connector 100 again includes a fastener 110, which may be threaded on its distal end 112, a spacer 240, and a nut 150. As in the previously described embodiments, the nut 150 may have any desired shape, may be press-fit into one of the pair of adjacent printed circuit boards, or may be integrally formed in one of the pair of adjacent printed circuit boards (e.g., printed circuit board 170, in FIG. 17). However, in contrast to the embodiments described with respect to FIGS. 1–6, the embodiments of FIGS. 7–18 include a spacer 240 that is formed from two distinct materials; an electrically conductive outer shell 248 that is formed from a conductive material, such as brass, copper, or aluminum, and an electrically insulating insert 249 that is formed from an insulating material, such as plastic.

According to an embodiment of the present invention, the outer shell 248 may be used to conduct electrical current between electrically conductive pads 166 (FIGS. 17–18) disposed on facing sides of the adjacent printed circuit boards 160, 170, while the electrically insulating insert 249 electrically isolates those components used to secure the connection (e.g., the fastener 110, the nut 150, and where used one or more washers, such as spring washer 120 and flat washer 130). As should be appreciated by those skilled in the art, the outer shell 248, the insulating insert, or both the outer shell 248 and the insulating insert 249 may be separately optimized for their particular use. For example, the outer shell 248 may be formed from materials selected based upon the material's electrical conductance, mechanical strength in compression, and thermal stability, as dependent upon the intended use. Where, for example, electrical conductance is a primary concern, the outer shell may be formed highly conductive materials, such as gold or platinum. Alternatively, where the cost of raw materials is more of a concern, less expensive conductive materials such as brass, copper, or aluminum may be used instead.

The insulating insert 249 may similarly be separately optimized for its insulating characteristics and conformance with applicable standards (e.g., UL, CSA, etc.), as well as its manufacturability, etc. Indeed, it should be appreciated that nearly any insulating material that is capable of electrically isolating the fastener from the outer shell 248 may be used for the insulating insert 249. Preferably the material from which the insulting insert is formed is sufficiently rigid so that it may include one or more mating features 241 capable of retaining the spacer 240 on the fastener 112.

Figure 7:
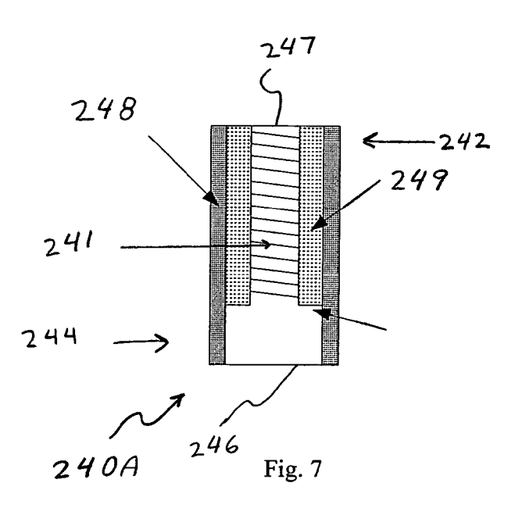
FIG. 7 illustrates a cross-sectional side view of a spacer that may be used to form a high current connection in accordance with an embodiment of the present invention.
Figure 8:
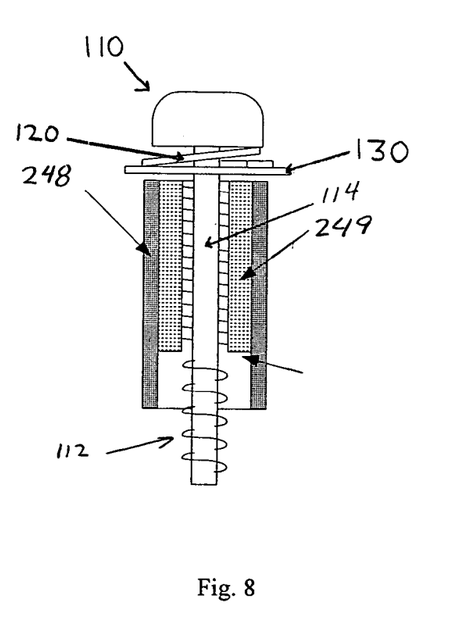
FIG. 8 illustrates a cross-sectional side view of a partially assembled connector that includes the spacer of FIG. 7.

FIGS. 7 and 8 illustrate a spacer 240A that is formed from two distinct materials in accordance with one embodiment of the present invention. As described above, the spacer 240A includes an electrically conductive outer shell 248 and an electrically insulating insert 249. In the illustrated embodiment of FIGS. 7–8, the outer shell 248 is outwardly cylindrical in shape, although other shapes may alternatively be used. The spacer 240A has a proximal portion 242 and a distal portion 244, with a bore 246 therethough to receive the insulating insert 249. As illustrated, the length of the insert 249 is preferably less than or equal to the length of the outer shell 248 to permit the ends of the outer shell 248 to make electrical contact with electrically conductive pads 166 (FIGS. 17–18) formed on facing sides of the printed circuit boards 160, 170. The insert 249 may be disposed centrally along the length of the outer shell 248, or may be disposed off center, for example, in the manner shown in FIGS. 7–8, where one end (e.g., the proximal end) is flush with the corresponding end of the outer shell 248, and the other end is spaced therefrom.

The insulating insert 249 may be prefabricated as a separate component, or alternatively may be molded inside the outer shell 248. For ease of manufacturing, the insulating insert 249 may be split into a number of parts, for example two halves split along the length of the insert, or alternatively two halves split along a longitudinal axis of the insert. Where the insulating insert 249 is prefabricated, it may either form an integral part of the spacer 240, or may be placed on the distal end 112 of the fastener 110 and then inserted into the outer shell 248 during assembly of the connector 100. To retain the insulating insert 249 in place within the outer shell 248, the insert 249 may be held in position by friction, by an adhesive, by mechanical locks or protrusions formed on an inner wall of the outer shell 248, by protrusions formed on the outer wall of the insert 249, or by any other manner known to those skilled in the art. Indeed, because the manner in which the insulating insert 249 is retained within the outer shell 248 need not be capable of withstanding great stresses, numerous other mounting alternatives may be readily envisioned.

As illustrated in the embodiment depicted in FIGS. 7–8, the electrically insulating insert 249 is outwardly cylindrical in shape, with a bore 247 therethrough to receive the distal end 112 of the fastener 110. It should be appreciated that the outward shape of the insulating insert 249 need not be cylindrical, as other shapes may be used. In general, the outward shape of the insert 249 will generally mirror the interior shape of the outer shell 248, but the present invention is not limited to any particular interior or exterior shape of the outer shell 248 or the insert 249. The insulating insert 249 includes at least one mating feature 241 that, in use, may be used to retain the spacer 240A on the distal end 112 of the fastener 110 during assembly of the connector 100. In the illustrated embodiment of FIGS. 7–8, the mating feature 241 is a plurality of helical threads adapted to receive and engage the threads on the distal end of the fastener 110.

Figure 9:
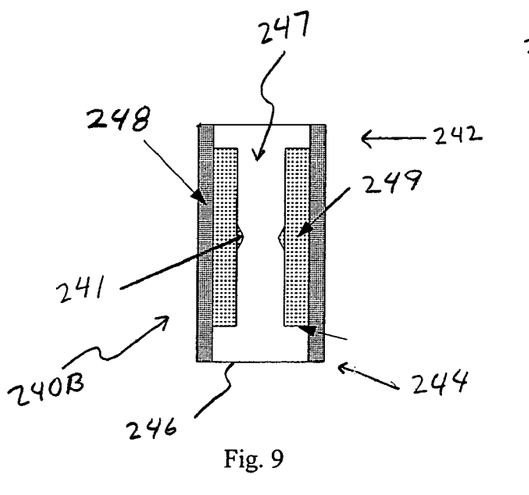
FIG. 9 illustrates a cross-sectional side view of a spacer that may be used to form a high current connection in accordance with another embodiment of the present invention.
Figure 10:
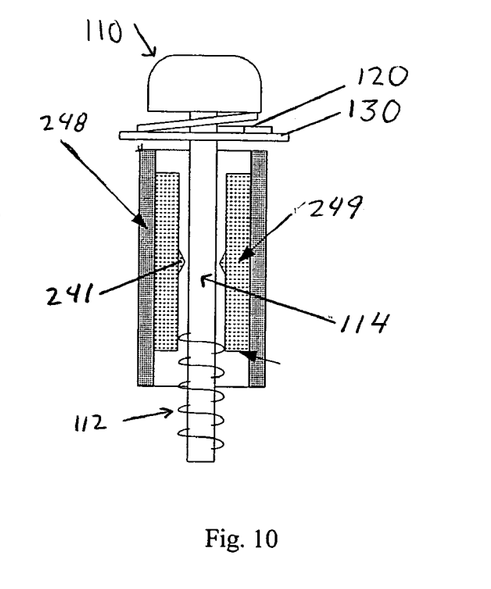
FIG. 10 illustrates a cross-sectional side view of a partially assembled connector that includes the spacer of FIG. 9.

FIGS. 9 and 10 illustrate an alternative embodiment of a spacer 240B formed from two distinct materials in accordance with another embodiment of the present invention. As the spacer 240B is quite similar to the spacer 240A described previously with respect to FIGS. 7–8, only the differences are described in detail herein.

As shown in the embodiment depicted in FIGS. 9–10, rather than a plurality of helical threads adapted to engage the threads on the distal end 112 of the fastener 110, the at least one mating feature 241 of this embodiment includes an annular protrusion. Because the amount of force needed to retain the spacer 240B on the fastener 110 during assembly is quite minimal, only a single annular protrusion is sufficient to retain the spacer 240C on the distal end 112 of the fastener 110 during assembly. It should be appreciated that more than one protrusion may be provided, and that depending on the shape of the bore 247 in the insert, the protrusion need not be annular. However, the number of protrusions should be few enough in number, so that the spacer 240B may be pressed upon the distal end of the fastener, and moved under an applied force proximally and distally, preferably by hand.

It should be appreciated that this embodiment of the present invention dispenses with the need to thread the spacer onto the distal end 112 of the fastener 110, and thus, assembly of the connector 100 is facilitated. Although the spacer 240B may still be threaded on the distal end 112 of the fastener 110, it may alternatively be pushed into position rather than threaded. Moreover, because the at least one mating feature 241 engages only a limited portion of the fastener 110, more conventional fasteners may be used therewith. For example, a screw that is threaded over the entirety of its distal end may be used rather than using a screw that is threaded only along its more distal portion, while still permitting movement of the spacer proximally and distally under an applied force, such as by hand. As in the previous embodiment, the length of the insert 249 is preferably less than or equal to the length of the outer shell 248 to ensure electrical contact between the outer shell 248 and the electrically conducting pads 166 on facing sides of the printed circuit boards, although the insert 249 need not be disposed centrally along the length of the outer shell 248 as depicted in FIGS. 9–10.

Figures 11, 12:
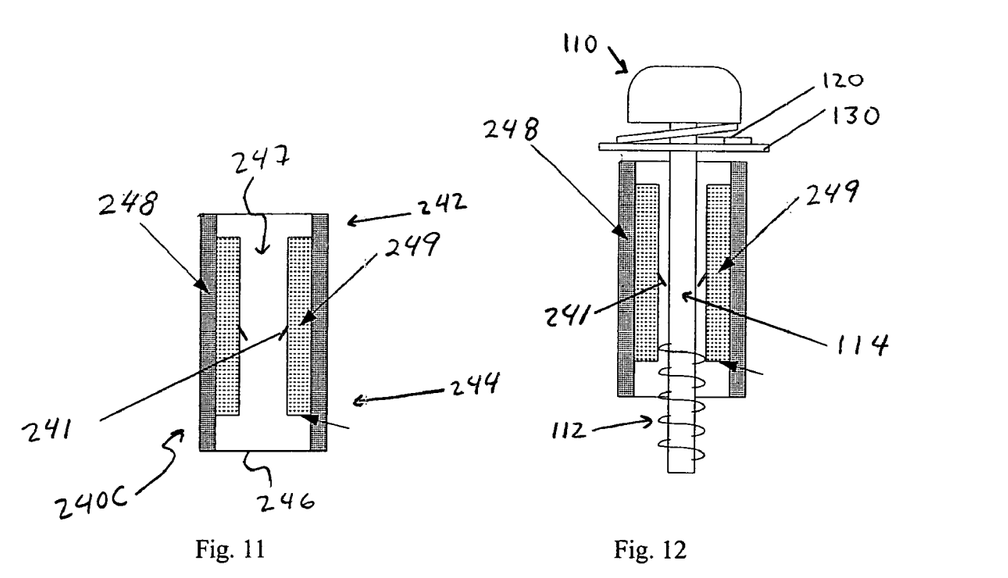
FIG. 11 illustrates a cross-sectional side view of a spacer that may be used to form a high current connection in accordance with another embodiment of the present invention.
FIG. 12 illustrates a cross-sectional side view of a partially assembled connector that includes the spacer of FIG. 11.
Figure 13:
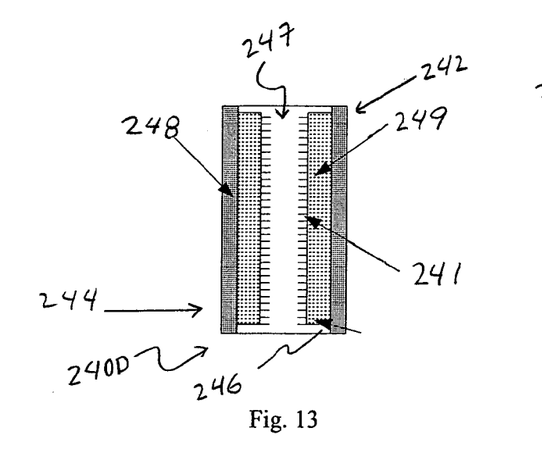
FIG. 13 illustrates a cross-sectional side view of a spacer that may be used to form a high current connection in accordance with yet another embodiment of the present invention.
Figure 14:
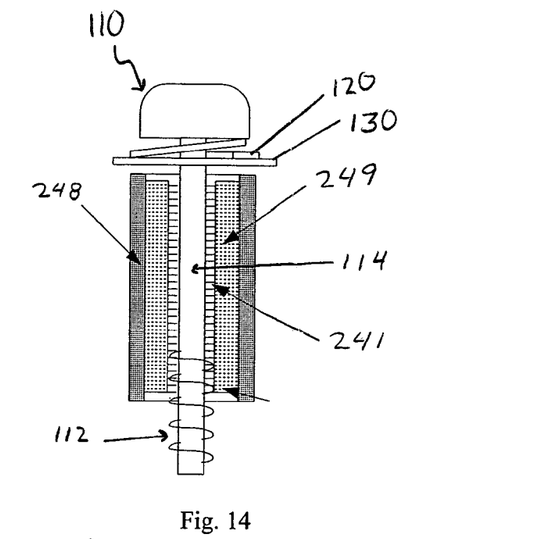
FIG. 14 illustrates a cross-sectional side view of a partially assembled connector that includes the spacer of FIG. 13.

FIGS. 11 and 12 illustrate an alternative embodiment of a spacer 240B formed from two distinct materials in accordance with another embodiment of the present invention. As the spacer 240C is quite similar to the spacer 240B described previously with respect to FIGS. 9–10, only the differences are described in detail herein.

As shown in the embodiment depicted in FIGS. 11–12, rather than a protrusion adapted to engage the threads on the distal end 112 of the fastener 110, the at least one mating feature 241 of this embodiment includes an annular tooth or finger. As shown in FIGS. 11–12, the tooth or finger may be biased in a particular direction to facilitate insertion of the fastener 110 and to prevent the spacer from falling off the distal end 112 of the fastener during assembly of the connector 110. Because the amount of force needed to retain the spacer 240C on the fastener 110 during assembly is quite minimal, only a single annular tooth or finger is sufficient to retain the spacer 240C on the distal end 112 of the fastener 110 during assembly. Indeed, the annular tooth or finger need not extend about the entire inner peripheral surface of the insert 249. It should be appreciated that more than one annular tooth or finger may be provided, and that depending on the shape of the bore 247 in the insert 249, the tooth or finger need not be annular. However, the number of teeth or fingers should be few enough in number, so that the spacer 240C may be pressed upon and moved along the distal end of the fastener, preferably by hand. It should be appreciated that this embodiment, like that of FIGS. 9–10, dispenses with the need to thread the spacer onto the distal end 112 of the fastener 110, and thus, assembly of the connector 100 is facilitated. As in the previous embodiment, the length of the insert 249 is preferably less than or equal to the length of the outer shell 248 to ensure electrical contact between the outer shell 248 and the electrically conducting pads 166 on facing sides of the printed circuit boards, although the insert 249 need not be disposed centrally along the length of the outer shell 248 as depicted in FIGS. 11–12.

FIGS. 13–14 and 15–16 illustrate further alternative embodiments of the present invention detailing various alternative mating features 241 that may be used in accordance therewith. In the embodiment depicted in FIGS. 13–14, the at least one mating feature 241 includes a plurality of hairs or whiskers disposed along the interior of the insert 249. The plurality of hairs or whiskers may be spaced radially apart from one another in rings as shown, or may be disposed in a random or semi-random pattern. Although each hair or whisker by itself might be incapable of retaining the spacer 240D on the distal end of the fastener 110, the retaining forces provided by a plurality of hairs or whiskers is sufficient to do so, while permitting the spacer 240C to be installed upon the distal end 112 of the fastener 110 and adjusted proximally and distally with a modicum of force. Alternatively, rather than a plurality of individual hairs, a plurality of thin annular rings may be provided. As with the previous embodiment, the mating features 241 of this embodiment dispense with the need to thread the spacer onto the distal end 112 of the fastener 110, and thus, assembly of the connector 100 is facilitated.

Figures 15, 16:
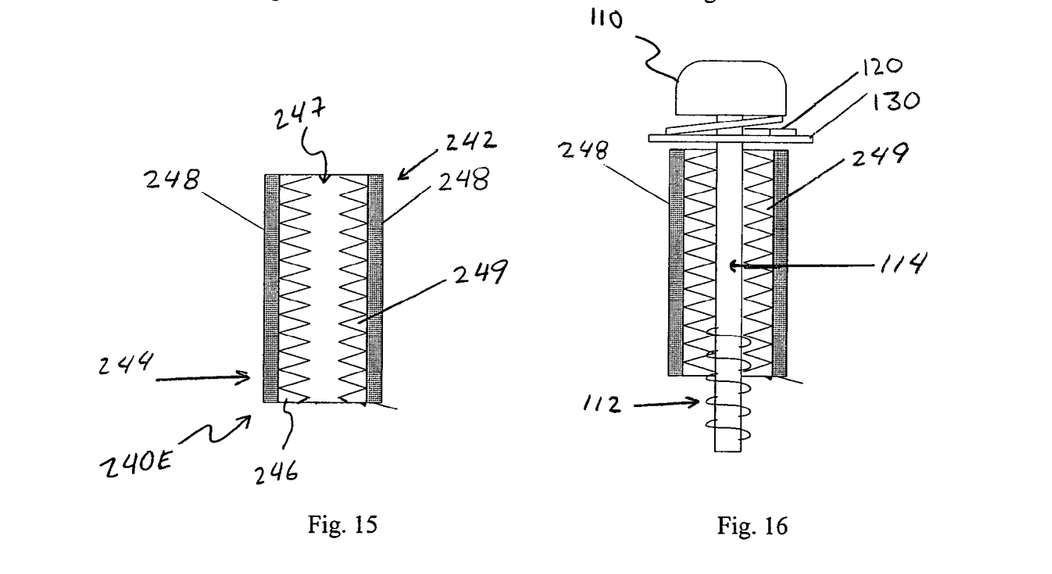
FIG. 15 illustrates a cross-sectional side view of a spacer that may be used to form a high current connection in accordance with a further embodiment of the present invention.
FIG. 16 illustrates a cross-sectional side view of a partially assembled connector that includes the spacer of FIG. 15.

FIGS. 15 and 16 illustrate yet another embodiment of the present invention, wherein the at least one mating feature 241 includes a plurality of annular teeth. Preferably the teeth are formed from a relatively flexible insulating material, such that the distal end 112 of the fastener 110 may be readily inserted into the spacer 240E, and the spacer 240E moved proximally and distally along the distal end of the spacer 240E with a modicum of force, while retaining the spacer 240E on the distal end of the fastener 110 during assembly of the connector 100.

Figure 17:
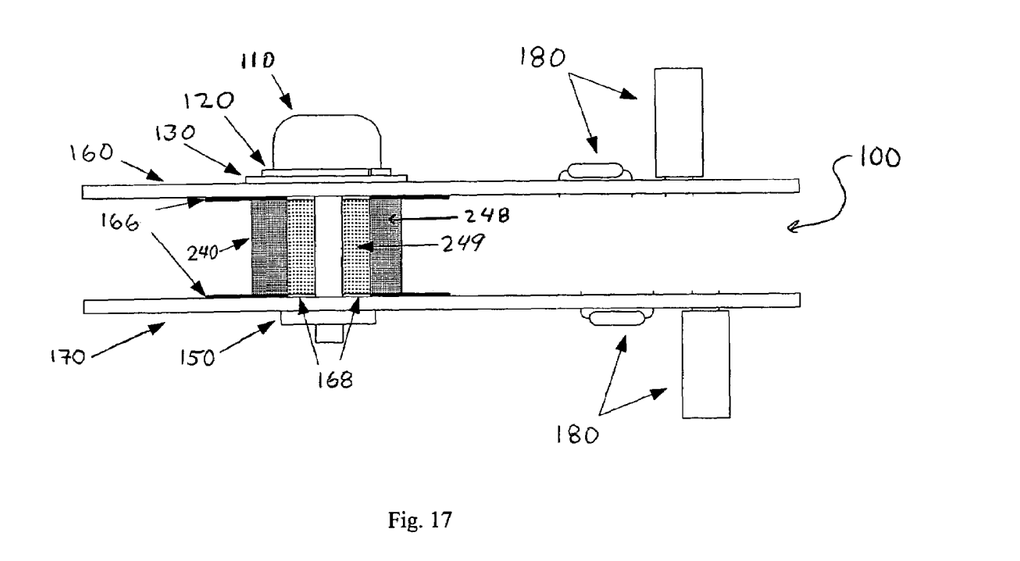
FIG. 17 illustrates a side view of a connector that provides an electrically insulated high current connection between adjacent printed circuit boards according to another embodiment of the present invention.
Figure 18:
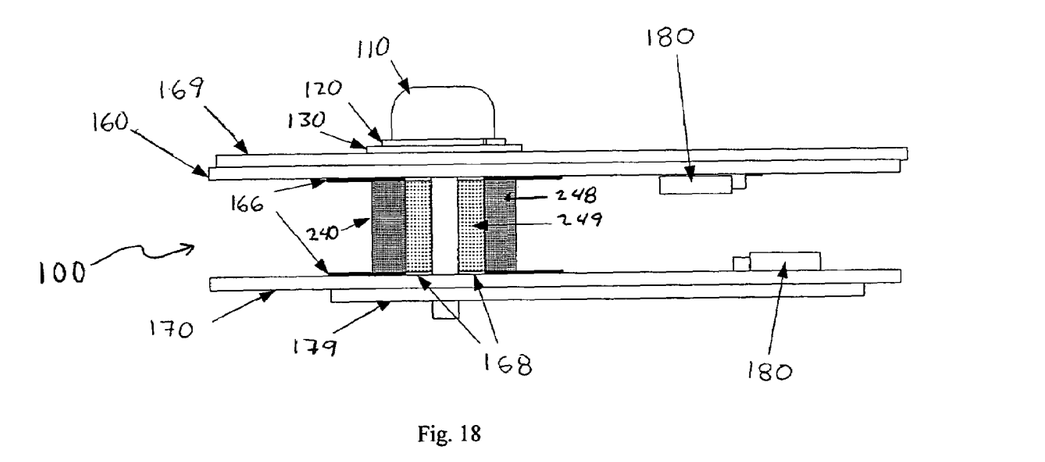
FIG. 18 illustrates a side view of a connector that provides an electrically insulated high current connection between adjacent printed circuit boards according to yet a further embodiment of the present invention.

FIGS. 17 and 18 illustrate two alternative printed circuit board assemblies utilizing a connector 100 that includes a spacer 240 in accordance with an embodiment of the present invention. In the embodiment depicted in FIG. 17, the connector 100 includes a fastener 110, a spring washer 120, a flat washer 130, a spacer 240, and a nut 150. As with the previously described embodiments, the spring washer 120 and the flat washer 130 may be preassembled onto the fastener 110 and provided as a single unit. Alternatively, other types of washers, such as a serrated lock washer, a disc washer, or another type of washer may be used. The nut 150 may be a separate component, may be press-fit, or alternatively, may be integrally formed in the printed circuit board 170. As shown, facing sides of each printed circuit board 160, 170 include electrically conductive pads 166 that are electrically connected via the outer conductive shell 248 of the spacer 240, and thus may be used to carry a high current between one printed circuit board and another. A space 168 is provided between each end of the insulating insert 249 and the corresponding end of the conductive outer shell 248 to ensure the electrical isolation of the fastener 110, the nut 150, and any washers 120, 130. Advantageously, because that portion of the connector 100 that secures the mechanical connection (e.g., the fastener 110, the nut 150, and/or the washers 120, 130) is electrically isolated from the portion of the connector that carries current, the spacer 240 may include a plurality of bores, each adapted to receive a fastener to secure the mechanical connection. This, in turn permits a larger spacer to be used, and thus, to carry more current while ensuring a solid electrical connection. Moreover, as the mechanical force would be spread over a number of distinct fasteners, alternatively engagement mechanisms, such as pop rivets could be used. Alternatively, because the mechanical force is spread over a number of distinct fasteners, the fastener need not have an enlarged head and may be replaced with a threaded member that is simply glued, soldered or welded to the first circuit board 160.

FIG. 18 illustrates an alternative configuration wherein opposing faces of each printed circuit board 160, 170 are at least partially covered by a conductive material, 169, 179, such as a heat sink, a base plate, or even a ground plane. Advantageously, because the portion of the connector 100 that secures the mechanical connection is electrically isolated from the portion of the connector that carries current, no current would be transmitted from the conductive outer shell of the spacer to the conductive material 169, 179.

Having now described some illustrative embodiments of the invention, it should be apparent to those skilled in the art that the foregoing is merely illustrative and not limiting, having been presented by way of example only. Numerous modifications and other illustrative embodiments are within the scope of one of ordinary skill in the art and are contemplated as falling within the scope of the invention. For example, rather than being separate components, the spacer and nut may be combined into a single component. The combined spacer/nut could be internally threaded, and inserted into printed circuit board 170 (FIG. 6) from below. A conducting pad could be placed on the under-surface of each of the printed circuit boards 160 and 170 to carry current between the two boards.

Although many of the examples presented herein involve specific combinations of method acts or system elements, it should be understood that those acts and those elements may be combined in other ways to accomplish the same objectives. Acts, elements and features discussed only in connection with one embodiment are not intended to be excluded from a similar role in other embodiments.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

What is claimed is:

1. An assembly, comprising:
   a pair of printed circuit boards each having a first side, a second side, and an aperture therethrough, the aperture being at least partially surrounded by an electrical conductor on the first side of each printed circuit board of the pair of printed circuit boards;
   a fastener that extends through the aperture of each printed circuit board;
   an electrically conductive spacer disposed about the fastener and between each printed circuit board; and
   a nut to engage a distal portion of the fastener and force the spacer into electrical contact with the electrical conductor disposed on the first side of each printed circuit board;
   wherein the spacer includes a retaining feature constructed to retain the spacer about the fastener after extension of the fastener through the aperture in a first printed circuit board of the pair of printed circuit boards and prior to extension of the fastener through the aperture in a second printed circuit board of the pair of printed circuit boards; and
   wherein electrical contact between the spacer and the electrical conductor disposed on the first side of each printed circuit board can be effected with access from only one of the two second sides of the pair of printed circuit boards.

2. The assembly of claim 1, wherein the nut is press fit into the aperture on the second side of the second printed circuit board of the pair of printed circuit boards.

3. The assembly of claim 1, wherein the nut includes means for preventing rotation of the nut as the fastener is rotated to force the spacer into electrical contact with the electrical conductor disposed on the first side of each printed circuit board.

4. The assembly of claim 1, wherein the fastener includes an enlarged head, the assembly further comprising:
   a flat washer disposed about the fastener and between the enlarged head of the fastener and the second side of the first printed circuit board of the pair of printed circuit boards; and
   a spring washer disposed about the fastener and between the enlarged head of the fastener and the flat washer.

5. The assembly of claim 1, wherein the spacer is constructed and arranged to conduct a current between approximately 10 amperes and 100 amperes between the pair of printed circuit boards.

6. The assembly of claim 1, wherein the nut is integrally formed in the second printed circuit board.

7. The assembly of claim 1, wherein the spacer comprises two distinct materials, including a first electrically conducting material, and a second electrically insulating material.

8. The assembly of claim 1, wherein the spacer is a rigid spacer.

9. The assembly of claim 1, wherein the spacer is a unitary spacer.

10. The assembly of claim 1, wherein the spacer is formed from a first material and the fastener is formed from a second material, and wherein the first material has a higher electrical conductance than the second material.

11. The assembly of claim 10, wherein the nut is formed from a third material, and wherein the first material has a higher electrical conductance than the third material.

12. The assembly of claim 11, wherein the second and third materials are stronger and more rigid than the first material.

13. The assembly of claim 1, wherein the fastener includes an enlarged head and a central portion disposed between the enlarged head and the distal portion of the fastener, and wherein the spacer is disposed about the central portion of the fastener and between each printed circuit board.

14. The assembly of claim 13, wherein the distal portion of the fastener is externally threaded, and wherein the central portion of the fastener is not threaded.

15. The assembly of claim 14, wherein the spacer includes a bore therethrough to receive the fastener, and wherein only a portion of the bore is internally threaded.

16. The assembly of claim 15, wherein the portion of the bore that is internally threaded has a length that is less than a length of the central portion of the fastener.

17. The assembly of claim 16, further comprising:
   a flat washer disposed about the central portion of the fastener and between the enlarged head of the fastener and the second side of the first printed circuit board of the pair of printed circuit boards.

18. The assembly of claim 17, further comprising:
   a spring washer disposed about the central portion of the fastener and between the enlarged head of the fastener and the flat washer.

19. The assembly of claim 18, wherein:
   the spacer is formed from a first material;
   the fastener is formed from a second material;
   the nut is formed from a third material;
   the first material has a higher electrical conductance than the second and third materials; and
   the second and third materials are stronger and more rigid than the first material.

20. A method of electrically connecting a pair of printed circuit boards each having a first side, a second side, and an aperture therethrough, the aperture being at least partially surrounded by an electrical conductor on the first side of each printed circuit board of the pair of printed circuit boards, the method comprising acts of:
   inserting a distal portion of a fastener through the aperture in a first printed circuit board of the pair of printed circuit boards;
   placing an electrically conductive spacer on the distal portion of the fastener;
   retaining the spacer on the digital portion of the fastener without manually holding the spacer;
   guiding the distal portion of the fastener into the aperture of a second printed circuit board of the pair of printed circuit boards; and
   tightening the fastener to force the spacer into electrical contact with the electrical conductor disposed on the first side of each printed circuit board.

21. The method of claim 20, wherein the act of retaining includes an act of permitting distal and proximal movement of the spacer along, and rotational movement of the spacer about, a length of the fastener.

22. The method of claim 20, wherein the act of tightening is performed with access from only one of the two second sides of the pair of printed circuit boards.

23. The method of claim 20, further comprising an act of: placing a spring washer and a flat washer on the distal portion of the fastener prior to the act of inserting.

24. The method of claim 23, wherein the distal end of the fastener is threaded, wherein the act of tightening the fastener includes an act of engaging threads on the distal end of the fastener with a nut disposed on the second side of the second printed circuit board, and wherein the act of engaging is performed without accessing the second side of the second printed circuit board during the act of engaging.

25. An assembly, comprising:
a pair of printed circuit boards each having a first side, a second side, and an aperture therethrough, the aperture being at least partially surrounded by an electrical conductor on the first side of each printed circuit board of the pair of printed circuit boards;
a fastener that extends through the aperture of each printed circuit board;
an electrically conductive spacer disposed about the fastener and between each printed circuit board; and
a nut to engage a distal portion of the fastener and force the spacer into electrical contact with the electrical conductor disposed on the first side of each printed circuit board;
wherein the spacer includes means for retaining the spacer about the fastener after extension of the fastener through the aperture in a first printed circuit board of the pair of printed circuit boards and prior to extension of the fastener through the aperture in a second printed circuit board of the pair of printed circuit boards.

26. The assembly of claim 25, wherein the spacer is constructed and arranged to conduct a current of approximately 10 amperes to approximately 100 amperes.

27. The assembly of claim 25, wherein the means for retaining permits electrical contact between the spacer and the electrical conductor disposed on the first side of each printed circuit board to be effected without accessing the second side of one of the pair of printed circuit boards.

28. The assembly of claim 25, wherein the means for retaining electrically isolates the spacer from the fastener.

29. An assembly comprising:
a pair of printed circuit boards each having a first side, a second side, and an aperture therethrough, the aperture being at least partially surrounded by an electrical conductor on the first side of each printed circuit board of the pair of printed circuit boards;
a fastener that extends through the aperture of each printed circuit board;
an electrically conductive spacer disposed about the fastener and between each printed circuit board; and
a nut to engage a distal portion of the fastener and force the spacer into electrical contact with the electrical conductor disposed on the first side of each printed circuit board, wherein the nut includes means for preventing rotation of the nut as the fastener is rotated;
wherein the fastener can be extended through the aperture in a first printed circuit board of the pair of printed circuit boards and the spacer retained about the fastener prior to insertion through the aperture in a second printed circuit board of the pair of printed circuit boards without manually holding the spacer.

30. The assembly of claim 29, wherein:
the spacer is formed from a first material;
the fastener is formed from a second material;
the nut is formed from a third material;
the first material has a higher electrical conductance than the second and third materials; and
the second and third materials are stronger and more rigid than the first material.

31. The assembly of claim 29, wherein the fastener includes an enlarged head, the assembly further comprising:
a flat washer disposed about the fastener and between the enlarged head of the fastener and the second side of the first printed circuit board of the pair of printed circuit boards; and
a spring washer disposed about the fastener and between the enlarged head of the fastener and the flat washer.

32. The assembly of claim 29, wherein the spacer is constructed and arranged to conduct a current between approximately 10 amperes and 100 amperes between the pair of printed circuit boards.

33. The assembly of claim 29, wherein the spacer comprises two distinct materials, including a first electrically conducting material, and a second electrically insulating material.

34. The assembly of claim 29, wherein the spacer is a rigid spacer.

35. The assembly of claim 29, wherein the spacer is a unitary spacer.

* * * * *